US009007071B2

(12) United States Patent
Gong et al.

(10) Patent No.: US 9,007,071 B2
(45) Date of Patent: Apr. 14, 2015

(54) INDUCTIVE PROXIMITY SENSOR

(75) Inventors: Xiaofeng Sean Gong, Shanghai (CN); Qiang Jacky Jin, Shanghai (CN); Frank J. Liao, Shanghai (CN)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 257 days.

(21) Appl. No.: 13/401,705

(22) Filed: Feb. 21, 2012

(65) Prior Publication Data

US 2012/0242352 A1 Sep. 27, 2012

(30) Foreign Application Priority Data

Feb. 22, 2011 (CN) .......................... 2011 1 0046071

(51) Int. Cl.
   *G01R 27/26* (2006.01)
   *H03K 17/95* (2006.01)
(52) U.S. Cl.
   CPC ........ *H03K 17/9525* (2013.01); *H03K 17/9502* (2013.01); *H03K 2017/9527* (2013.01)
(58) Field of Classification Search
   CPC ............ H03K 17/952; H03K 17/9512; H03K 17/9547; G01V 3/10
   See application file for complete search history.

(56) References Cited

U.S. PATENT DOCUMENTS

| | | | | |
|---|---|---|---|---|
| 5,223,830 A * | 6/1993 | Romes | ..................... | 340/870.35 |
| 6,304,076 B1 * | 10/2001 | Madni et al. | ............. | 324/207.17 |
| 6,657,323 B2 * | 12/2003 | Muller | ......................... | 307/116 |
| 7,301,391 B2 * | 11/2007 | Jaussi et al. | ................... | 327/552 |
| 8,115,498 B1 * | 2/2012 | Lumbab | ........................ | 324/677 |
| 8,203,335 B2 * | 6/2012 | Feldtkeller | ............... | 324/207.26 |
| 8,258,777 B2 * | 9/2012 | Chen | ........................ | 324/207.15 |
| 2010/0296973 A1 * | 11/2010 | Hefti et al. | ................. | 422/82.02 |

* cited by examiner

*Primary Examiner* — Arleen M Vazquez
*Assistant Examiner* — Feba Pothen
(74) *Attorney, Agent, or Firm* — Fletcher Yoder, P.C.

(57) ABSTRACT

Present techniques provide an inductive proximity sensor having a multi-receiver coil assembly and an evaluator circuit configured to receive a differential signal from the multi-receiver coil assembly to determine the presence of a target. The multi-receiver coil assembly includes two receiver coils in a differential coil arrangement and a transmitter coil configured to emit an electromagnetic field and induce a voltage on each of the receiver coils. The voltage difference between the two receiver coils is transmitted as a differential signal to the evaluator circuit. Targets which approach the inductive proximity sensor disrupt the electromagnetic field and change the induced voltages on each of the receiver coils, thereby changing the differential signal. The evaluator circuit processes the differential signal to determine whether the changes indicate that a target is present.

23 Claims, 4 Drawing Sheets

INDUCTIVE PROXIMITY SENSOR

CROSS REFERENCE TO RELATED APPLICATIONS

This application claims priority from and the benefit of Chinese Patent Application No. 201110046071.1, filed on Feb. 22, 2011; entitled "Inductive Proximity Sensor", which is herein incorporated by reference.

BACKGROUND

The invention relates generally to inductive proximity sensors. More particularly, the invention relates to inductive proximity sensor configurations having improved target detection.

Conventional inductive proximity sensors are generally known for sensing the presence of targets of interest in a sensing region. Such devices typically include an LC tuned oscillator for producing an oscillating electromagnetic field around a sensing coil. The sensing coil may typically have a ferrous core, which may have a T-shaped or E-shaped cross section. The sensing coil may shape and extend the electromagnetic field surrounding the coil in a sensing direction and/or concentrate or channel the electromagnetic field in other directions, such as behind and to the sides of the coil. A target which enters the sensing region of the proximity sensor may disrupt the electromagnetic field around the sensing coil and change the impedance of the coil sufficiently to alter the oscillating state of the electromagnetic field. A proximity sensor may include an evaluator circuit having control circuitry for providing feedback indicative of the presence of a target of interest (e.g., typically a metal).

While advances have been made in the design of proximity sensors, such as to improve their sensing range and sensitivity, conventional proximity sensors may not perform consistently in certain applications. For example, inductive proximity sensors may often be used to detect the presence of different targets composed of various metals. However, different targets (e.g., steel and copper) typically have different effects on the impedance of the sensing coil, resulting in different sensing distance ratios for different metals. Furthermore, inductive proximity sensors are often used in applications where the sensor is required to operate in the presence of a strong external electromagnetic field, such as in the vicinity of resistive welding machines and other equipment. Such external electromagnetic fields may influence the performance of the sensors, such as by causing the ferrite core to saturate, thereby changing the sensitivity of the sensor and causing the output circuitry to malfunction. Typical proximity sensors are mounted in a surrounding system, which may be defined as a mechanical system in which the sensor is mounted. As the surrounding system is usually closer than a target of interest, the proximity sensor may sometimes return a fault trigger, where the surrounding system is sensed, rather than the target of interest. Moreover, typical evaluation circuitry may generally use complex feed-forward or synchronous demodulation techniques. Such configurations further increase the complexity and cost of the typical proximity sensor.

BRIEF DESCRIPTION

The present invention relates to an inductive proximity sensor having a multiple-receiver coil assembly and an evaluator circuit suitable for receiving a differential signal from the coil assembly. In one embodiment, the multiple-receiver coil assembly includes at least one transmitter and two anti-connected receivers. In operation, due to inductance coupling between the transmitter and receivers, the two anti-connected receivers have an induced voltage, and the differential signal of the two induced voltages may be analyzed to determine the presence of a target. In some embodiments, the inductive proximity sensor includes an evaluator circuit which receives the differential signal, determines a change in the differential signal, and determines whether a target is present based on a comparison between the change and a threshold.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Typical inductive proximity sensors include a coil assembly having a ferrous core. The coil assembly is driven by an oscillator to emit an electromagnetic field. When a target (i.e., an object to be sensed by the proximity sensor, usually composed of metal) enters a sensing region of the electromagnetic field, it increases the impedance of the coil, resulting in a change in oscillation amplitude of the electromagnetic field emitted by the coil. The change in oscillation amplitude is detected by an evaluator circuit which may compare the change to a threshold change and trigger an output circuit to indicate the presence of the target.

Such inductive proximity sensors may have various performance drawbacks. Basing target detection on changes in the coil's impedance may lead to different ranges of detection for different types of targets, as various metals may have varying effects on the coil's impedance. For example, steel and copper may have different eddy-current induction capabilities, and typical inductive proximity sensors may have different sensing distances for each metal. The sensing distance ratio for steel and copper may be relatively large at approximately 1.0:0.3. Large sensing distance ratios between different types of targets may lead to poor performance in certain applications where the proximity sensor may be used to sense targets composed of different metals.

Moreover, using changes in coil impedance for target detection may also result in fault triggers (i.e., determining and indicating the presence of a target when no target is actually present). For instance, proximity sensors are typically mounted in a surrounding system. The surrounding system may also have an effect on the impedance of the coil, which may result in changes in the electromagnetic field of the coil assembly, such that the evaluator circuit inaccurately determines that a target is present. As the surrounding system is generally closer to the coil assembly than a target, the proximity sensor may indicate that a target is present when it is not, or that a target is closer than it actually is.

The ferrous core of typical inductive proximity sensors may also affect the performance of the proximity sensor after time, as the ferrous materials of the core may be easily saturated by strong electromagnetic fields. Therefore, in certain applications, such as those where proximity sensors are used in the vicinity of high electromagnetic fields, such as resistive welding machines, saturation of the ferrous core may result and cause deterioration in the performance of the proximity sensor.

Figure 1:
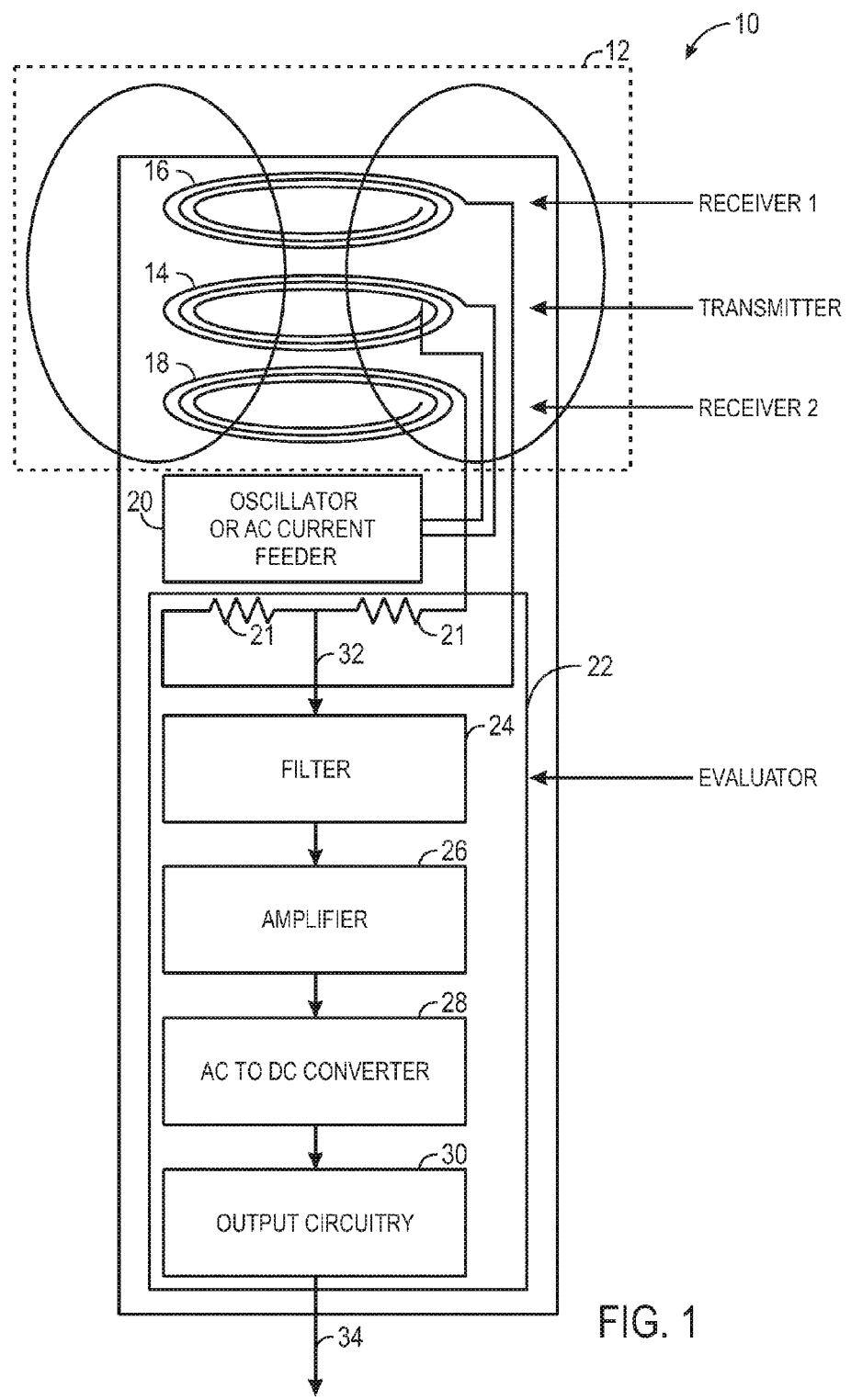
FIG. 1 is a schematic diagram of an inductive proximity sensor, in accordance with an embodiment of the present techniques.

One or more embodiments of the present techniques include different coil assembly configurations and evaluator circuit configurations which at least partially address such performance shortcomings of typical inductive proximity sensors. FIG. 1 is a schematic diagram of one embodiment of an inductive proximity sensor 10 having a multiple receiver coil assembly (multi-receiver coil assembly) 12 and an evaluator circuit 22. The multi-receiver coil assembly 12 has at least one transmitter 14 and two receivers 16, 18. In some embodiments, the transmitter 14 and two receivers 16, 18 may each have a coil shape. These features may also be referred to as the transmitting coil 14 and the receiving coils 16, 18, respectively. The transmitter 14 is connected to an oscillator 20 or any other suitable alternating current provider which generates an alternating voltage to cause the transmitter 14 to emit an electromagnetic field.

The electromagnetic field generated by the transmitter 14 induces a voltage in each of the receivers 16, 18 through inductance coupling. The two receivers 16, 18 are anti-connected; that is, the two receivers 16, 18 are connected in a differential coil arrangement. One terminal of each of the receiving coils 16, 18 are connected to a common ground, and the other terminal of each coil 16, 18 are connected to two resistors 21 (e.g., to form a bridge circuit) and to the evaluator circuit 22 which detects the voltage differential between the two receivers 16, 18 to determine if a target is detected. If the electromagnetic field emitted by the transmitter 14 is disturbed by an approaching target, the induced voltages in at least one of the two receivers 16, 18 will also change, as the target is typically closer to one of the receivers 16, 18 than the other.

The inductance changes (also referred to as voltage changes) of the receivers 16, 18 result in a change in their differential signal 32. In some embodiments, this differential signal 32 passes to the filter 24, an amplifier 26, an AC/DC converter 28, and output circuitry 30 in the evaluator circuit 22. As will be further explained with respect to FIGS. 5 and 6, the output circuitry 30 of the evaluator circuit 22 may provide an output signal 34 to indicate the presence of a target.

Embodiments of the present techniques may reduce the sensing distance ratios between different target metals to be detected. Target detection is based on the change in the differential signal 32 of the two receivers 16, 18, and so detection is based on change in inductance coupling rather than on change in impedance. Inductance coupling changes are generally less dependent on the material of a target in comparison to impedance changes, so different types of target materials are less likely to generate a wide range of changes in inductance coupling in comparison to changes in impedance. Therefore, even in applications where the inductive proximity sensor 10 is used to sense the proximity of different types of targets, the detected change in inductance coupling of the two receivers 16, 18 generally will not vary significantly across targets having different metal compositions.

Furthermore, in some embodiments, the differential coil arrangement of the receivers 16, 18 is also suitable for cancelling out the effects from other objects (e.g., objects that are not the target to be detected). In different embodiments, based on the known configuration of the multi-receiver coil assembly 12 and based on known inductance effects of non-target objects, the evaluator circuit 22 processes the differential signal 32 to filter out or compensate for inductance changes caused by non-target objects. For instance, while typical inductive proximity sensors often generate fault triggers by mistaking a surrounding system for a detected target, the inductive proximity sensor 10 of the present techniques may be more accurate for detecting only a target of interest. In some embodiments, the receiving coils 16, 18 are arranged in a certain way such that inductance changes caused by a surrounding system (e.g., mounting hardware of the proximity sensor 10) may be canceled out. For example, if a surrounding system were arranged to mount the inductive proximity sensor 10 at a position flush with the surface of the sensor 10, the receiver coils 16, 18 may be configured (e.g., by different designs and/or sizes) to cancel out the effects of the surrounding system.

In one embodiment, the multi-receiver coil assembly 12 has a coil configuration without a ferrous core. For example, the transmitting coil 14 and receiving coils 16, 18 may each be planar coils on a printed circuit board (PCB) or air-core wound coils. In some embodiments, the multi-receiver coil assembly 12 uses some combination of planar coils on PCB or air-core wound coils for the transmitting coil 14 and receiving coils 16, 18. Such coil configurations typically do not include a ferrous core. By configuring a multi-receiver coil assembly 12 without a ferrous core, the inductive proximity sensor 10 may be less susceptible to high electromagnetic fields, and may be less likely to degrade under such operating conditions.

Figure 2:
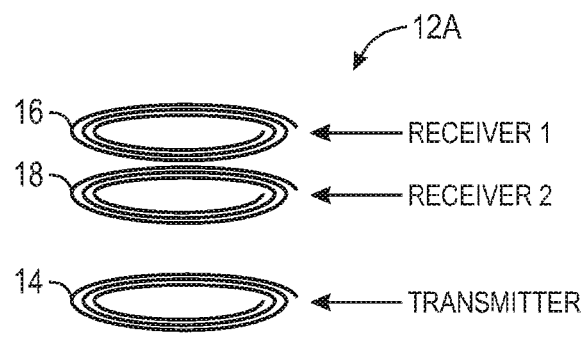
FIG. 2 is a schematic diagram of an arrangement of a multi-receiver coil structure in the inductive proximity sensor of FIG. 1, in accordance with an embodiment of the present techniques.
Figure 3:
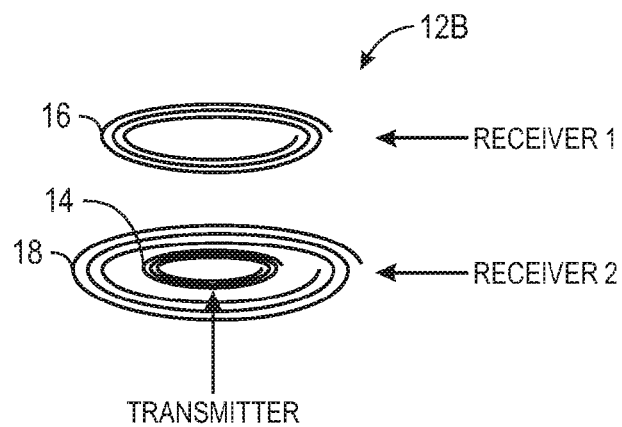
FIG. 3 is schematic diagram of another arrangement of a multi-receiver coil structure in the inductive proximity sensor of FIG. 1, in accordance with an embodiment of the present techniques.
Figure 4:
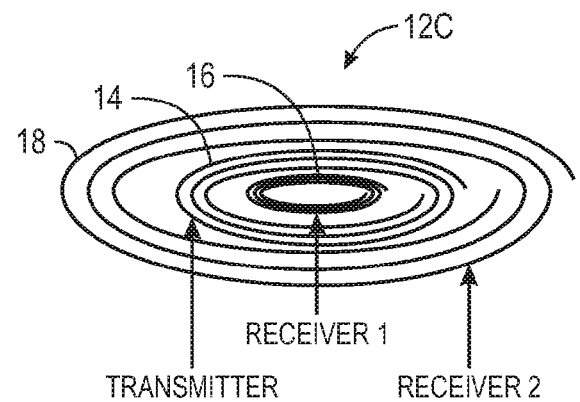
FIG. 4 is a schematic diagram of another arrangement of a multi-receiver coil structure in the inductive proximity sensor of FIG. 1, in accordance with an embodiment of the present techniques.

While the transmitter 14 is arranged parallel with, axially adjacent to, and between the two receivers 16, 18 in FIG. 1, in different embodiments of the inductive proximity sensor 10, the transmitter 14 and receivers 16, 18 are arranged in various other configurations. As provided in FIG. 2, the multi-receiver coil assembly 12a has two receivers 16, 18 arranged to be parallel and axially adjacent relative to one another. The transmitter 14 may be parallel with and axially adjacent to one of the receivers 18. In another embodiment represented in FIG. 3, a multi-receiver coil assembly 12b may include the transmitting coil 14 arranged planar to and concentrically within one receiving coil 18. The second receiver 16 may be parallel with and axially adjacent to the concentrically arranged receiving coil 14 and transmitting coil 18. Furthermore, as provided in FIG. 4, some embodiments may include a multi-receiver coil assembly 12c having transmitting and receiving coils 14, 16, 18 all concentrically arranged in the same plane. For example, as provided in FIG. 4, the transmitting coil 14 may be concentrically between and planar to the two receiving coils 16, 18.

In other embodiments, an inductive proximity sensor 10 includes a multi-receiver coil assembly 12 having other configurations. Furthermore, in some embodiments, the multi-receiver coil assembly 12 has multiple transmitters 14, and in some embodiments, the multi-receiver coil assembly 12 has more than two receivers. In some embodiments, the multi-receiver coil assembly 12 has two transmitters 14 and no receivers. In such configurations, the transmitters 14 may inductively couple, and a differential signal between the two transmitters may be sampled for target detection.

In addition to the design of the multi-receiver coil assembly 12 in the inductive proximity sensor 10, embodiments of the present techniques also include an evaluator circuit 22 suitable for efficiently processing the differential signal 32 from the anti-connected receivers 16, 18 to detect an approaching target. While typical inductive proximity sensors generally include complex evaluator circuitry, such as positive feedback circuitry and synchronous demodulation circuitry, some embodiments of the present techniques include an evaluator circuit 22 suitable for detecting and processing a differential signal 32 from the multi-receiver coil assembly 12 and analyzing a change in the differential signal 32 to determine the presence of a target. For instance, in some embodiments, the evaluator circuit 22 need not include a demodulator or complex circuitry needed for positive feedback. Rather, the evaluator circuit 22 may simply filter and/or amplify a differential signal 32 from a multi-receiver coil assembly 12 to detect a target.

Figure 5:
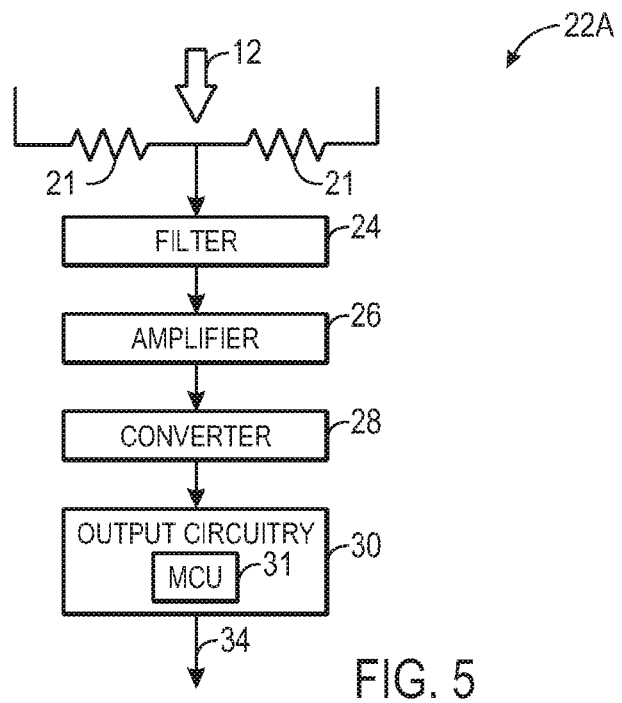
FIG. 5 is a schematic diagram of an evaluator circuit in the inductive proximity sensor of FIG. 1, in accordance with an embodiment of the present techniques.
Figure 6:
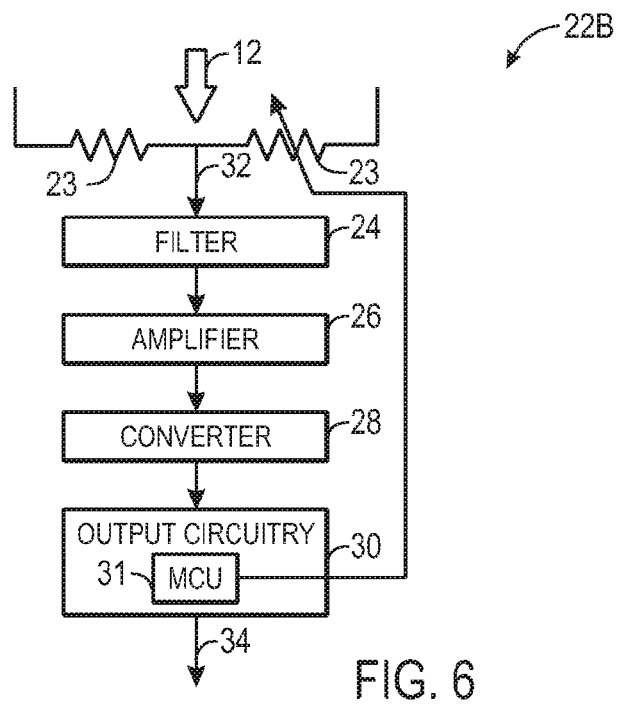
FIG. 6 is a schematic diagram of an evaluator circuit having potentiometers in the inductive proximity sensor of FIG. 1, in accordance with an embodiment of the present techniques.

Different embodiments of the evaluator circuit 22 are illustrated in FIGS. 5 and 6. Beginning first with FIG. 5, the evaluator circuit 22a receives the differential signal 32 from the multi-receiver coil assembly 12 and processes the differential signal 32 to determine changes in the differential signal 32 which indicate the presence of a target. In some embodiments, the resistors 21 are configured such that the differential signal 32 can be measured between the resistors 21. In some embodiments, the resistors 21 have a resistance (which may either be different or the same) based on the manufacturing tolerance of the coils in the multi-receiver coil assembly 12. In other embodiments, as will be described, the resistors 21 are potentiometers 21 having resistances which are adjustable by the output circuitry 30. The differential signal 32 is transmitted to a filter 24 to increase the signal-to-noise ratio (SNR) of the differential signal 32. The filtered differential signal 32 is then amplified by the amplifier 26, such that changes in the differential signal 32 may be easier to detect. The amplified signal is then converted from AC to DC by the converter 28.

The output circuitry 30 then receives the filtered and amplified DC signal to determine whether a target is present. In one embodiment, the output circuitry 30 compares the change in the sampled differential signal (e.g., in the form of a DC voltage) to a threshold (e.g., threshold voltage). Changes in the differential signal 32 above a certain threshold may indicate the presence of a target. In some embodiments, the output circuitry 30 includes a microcontroller unit (MCU) 31 which outputs a signal 34 to indicate when a target is detected. In some embodiments, the output circuitry 30 may include circuitry for further filtering the sampled differential signal, thereby further improving the SNR.

In some embodiments, the evaluator circuit may include potentiometers having resistances adjustable by the MCU of the output circuitry. For example, as illustrated in FIG. 6, the evaluator circuit 22b includes potentiometers 23 (e.g., in place of the resistors 21 of FIG. 5). In some embodiments, the MCU 31 is configured to adjust the potentiometer 21 based on the sampled differential signal. For example, the MCU 31 may adjust the resistances of the potentiometer 21 to make the differential signal 32 easier to filter, amplify, and/or process.

In different embodiments, the converter 28 may not be necessary. For example, in some embodiments, as illustrated in FIGS. 5 and 6, the AC signal is converted to a DC voltage by an AC/DC converter 28 and transmitted to the output circuitry 30, and the output circuitry 30 compares the DC voltage with a threshold voltage to determine the presence of a target. In other embodiments, the AC voltage is directly sampled by the output circuitry 30. For example, in some embodiments, the MCU 31 in the output circuitry 30 samples the differential signal 32. As such, the evaluator circuit 22 may or may not include the converter 30, depending on the configuration of the evaluator circuit 22.

Figure 7:
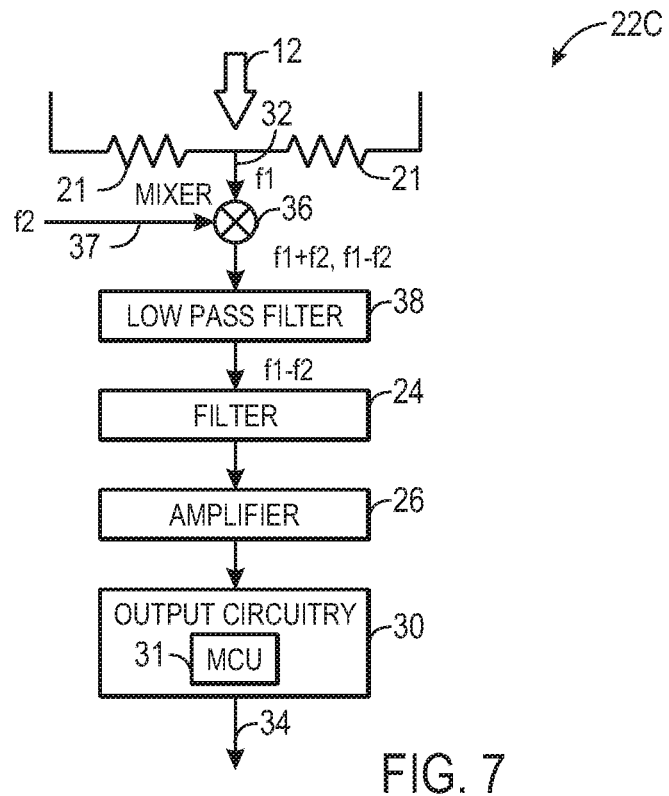
FIG. 7 is a schematic diagram of another embodiment of the evaluator circuit in the inductive proximity sensor of FIG. 1, in accordance with an embodiment of the present techniques

FIG. 7 is a schematic diagram representing another embodiment of an evaluator circuit 22c. The evaluator circuit 22c receives the differential signal 32 from the multi-receiver coil assembly 12. The differential signal 32 is transmitted to a mixer 36 which mixes the differential signal 32 with a second signal 37. This second signal 37 may be any alternating current generated by a signal generator (e.g., an oscillator), and may typically have a frequency f2 that is different from the frequency f1 of the differential signal 32. The frequency f1 of the differential signal 32 may be substantially similar to the oscillation of the receiver coils 16, 18. The mixer 36 outputs the mixed signal, represented as having mixed frequencies of f1+f2 and f1−f2, to a low pass filter 38, which filters out high frequencies and outputs the remaining low frequencies (represented as f1−f2) of the mixed signal, as lower frequencies are typically more readily converted (e.g., relative to higher frequencies) for sampling. The low pass filtered signal is then transmitted to a filter 24 and an amplifier 26 which respectively increase the SNR and amplify the signal before it is transmitted to the output circuitry 30. In one embodiment, the output circuitry 30 samples the differential signal to determine changes in the differential signal and compares the differential signal changes to a threshold. In some embodiments, the output circuitry 30 outputs a signal 34 to indicate when a target is detected when the differential signal change is greater than the threshold.

As discussed, in some embodiments, the evaluator circuit includes potentiometers, and the differential signal is measured from between two or more potentiometers. For example, the evaluator circuit 22d illustrated in FIG. 8 includes two potentiometers 23 which are controlled by the MCU 31 of the output circuitry 30.

Figure 8:
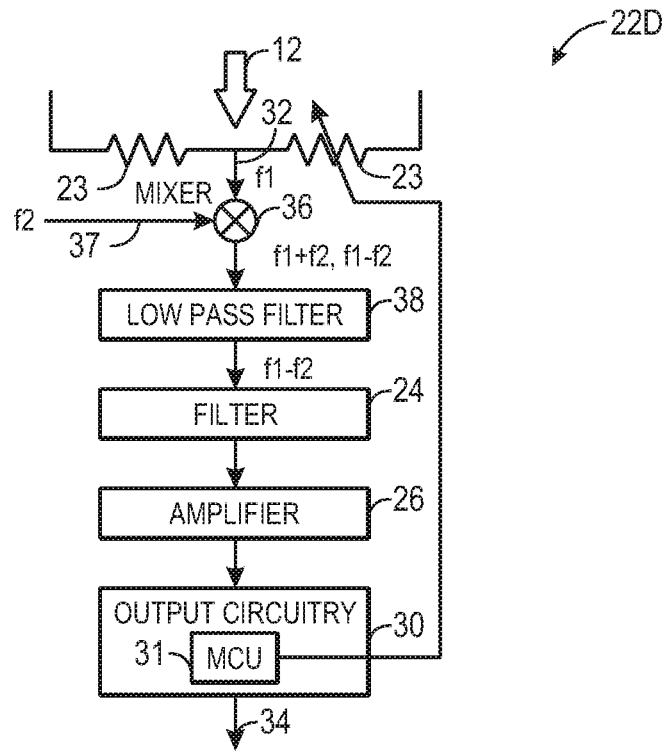
FIG. 8 is a schematic diagram of another embodiment of the evaluator circuit having potentiometers in the inductive proximity sensor of FIG. 1, in accordance with an embodiment of the present techniques.

Furthermore, while the embodiments illustrated in FIGS. 7 and 8 include an MCU 31 configured to directly sample the differential signal 32, in some embodiments, the evaluator circuits 22c and 22d may also include an AC/DC converter suitable for converting the differential signal into a discretized (i.e., sampled, digital) differential signal.

In different embodiments, the output circuitry 30 of the evaluator circuit 22 may be different depending on the arrangement of the multi-receiver coil assembly 12. For instance, depending on the expected inductance changes in the receivers 16, 18, the output circuitry may compare the differential signal changes to different thresholds. Furthermore, depending on expected inductance changes from non-target objects (e.g., the surrounding system), the filter 24 may be adjusted to filter out non-target induced changes. In some embodiments, based on known or common targets, other aspects of the evaluator circuit 22 may be adjusted to improve target detection.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An evaluator circuit, comprising:
   a first resistor configured to electrically couple to a first receiver coil of an inductive proximity sensor, wherein a first resistor value of the first resistor is determined based on a first tolerance of the first receiver coil;
   a second resistor configured to electrically couple to a second receiver coil of the inductive proximity sensor, wherein a second resistor value of the second resistor is determined based on a second tolerance of the second receiver coil, wherein the first resistor is configured to electrically couple to the second resistor at a node;
   a filter configured to generate a filtered differential signal by filtering noise from a differential signal between a first voltage signal associated with the first receiver coil and a second voltage signal associated with the second receiver coil, wherein the filter receives the differential signal via the node;
   an amplifier configured to generate an amplified differential signal by amplifying the filtered differential signal; and
   output circuitry configured to compare a change in the amplified differential signal with a first threshold and indicate a detected target when the change in the the filtered differential signal is above the first threshold.

2. The evaluator circuit of claim 1, comprising an AC/DC converter configured to convert the amplified differential signal to a sampled differential signal.

3. The evaluator circuit of claim 1, wherein the output circuitry comprises circuitry is configured to sample the amplified differential signal to produce a sampled differential signal.

4. The evaluator circuit of claim 1, wherein the first resistor comprises a first potentiometer and the second resistor comprises a second potentiometer.

5. The evaluator circuit of claim 1, wherein the output circuitry comprises a microcontroller unit (MCU) configured to adjust the first resistance and the second resistance to affect the differential signal.

6. The evaluator circuit of claim 1, comprising a mixer and a low pass filter, wherein the mixer is configured to:
   mix the differential signal with an additional signal to generate a mixed signal; and
   output the mixed signal to the low pass filter.

7. The evaluator circuit of claim 6, wherein the low pass filter is configured to filter higher frequencies from the mixed signal and output lower frequencies of the mixed signal, wherein the higher frequencies are higher than a second threshold, and wherein the lower frequencies are lower than the second threshold.

8. The evaluator circuit of claim 6, wherein the output circuitry comprises a microcontroller unit (MCU), and wherein the MCU comprises an additional filter configured to filter the amplified differential signal.

9. An inductive proximity sensor comprising:
   a multi-receiver coil assembly comprising:
      a first receiver;
      a second receiver arranged in a differential coil arrangement with the first receiver; and
      a transmitter configured to:
         emit an electromagnetic field;
         inductively couple with the first receiver to induce a first voltage on the first receiver; and
         inductively couple with the second receiver to induce a second voltage on the second receiver; and
   an evaluator circuit configured to receive a differential signal from the multi-receiver coil assembly, wherein the evaluator circuit comprises:
      a first resistor configured to receive the first voltage, wherein a first resistance value of the first resistor is determined based on a first tolerance of the first receiver;
      a second resistor configured to receive the second voltage, wherein a second resistance value of the second resistor is determined based on a second tolerance of the second receiver;
      a node configured to electrically couple to the first resistor and the second resistor;
      a filter configured to generate a filtered differential signal by filtering noise from a differential signal generated based on a voltage difference between the first voltage and the second voltage, wherein the filter receives the differential voltage signal via the node;
      an amplifier configured to generate an amplified differential signal by amplifying the differential signal; and
      an output circuit configured to determine a change in the amplified differential signal and indicate a detected target based on a comparison of the change with a threshold.

10. The inductive proximity sensor of claim 9, wherein the first receiver, the second receiver, and the transmitter each include an air-wound coil.

11. The inductive proximity sensor of claim 9, wherein the transmitter is parallel with, axially adjacent to, and between the first receiver and the second receiver.

12. The inductive proximity sensor of claim 9, wherein the second receiver is parallel with, axially adjacent to, and between the first receiver and the transmitter.

13. The inductive proximity sensor of claim 9, wherein the transmitter is concentrically within the second receiver, and wherein the first receiver is parallel with and axially adjacent to the transmitter and the second receiver.

14. The inductive proximity sensor of claim 9, wherein the transmitter is concentrically between and planar with the first receiver and the second receiver.

15. The inductive proximity sensor of claim 9, wherein the output circuit comprises a microcontroller unit (MCU) configured to output a signal indicative of the detected target based on the comparison of the change with the threshold.

16. The inductive proximity sensor of claim 9, wherein the evaluator circuit comprises a mixer configured to mix the differential signal with an additional signal to generate a mixed signal having high frequencies and low frequencies.

17. The inductive proximity sensor of claim 16, wherein the evaluator circuit comprises a low pass filter configured to receive the mixed signal, filter out the high frequencies, and output the low frequencies.

18. The inductive proximity sensor of claim 9, comprising a converter configured to convert the amplified differential signal to a discretized differential signal, wherein the output circuit is configured to determine a second change in the discretized differential signal and indicate the detected target based on a comparison of the second change with a second threshold.

19. The inductive proximity sensor of claim 9, wherein the output circuit is configured to sample the amplified differential signal to produce a sampled differential signal.

20. The inductive proximity sensor of claim 19, wherein the output circuit comprises a microcontroller unit configured to adjust the first resistance value and the second resistance value based on the sampled differential signal, wherein the first resistor comprises a first potentiometer coupled to the microcontroller unit and the second resistor comprises a second potentiometer coupled to the microcontroller unit.

21. A method of detecting a target with an inductive proximity sensor, the method comprising:
   generating an electromagnetic field at a transmitter to induce a voltage on at least two receivers arranged in a differential coil arrangement;
   generating a differential signal from the at least two receivers based on the voltage and at least two resistors having at least two resistance values, wherein the at least two resistors are coupled with the differential coil arrangement, and wherein the at least two resistance values are determined based on tolerances associated with the at least two receivers;
   filtering the differential signal to generate a filtered differential signal;
   amplifying the filtered differential signal to generate an amplified differential signal;
   sampling the amplified differential signal to generate a sampled differential signal;
   determining a change in the sampled differential signal; and
   determining whether a target is detected based only on a comparison between the change and a threshold.

22. The method of claim 21, comprising:
   mixing the differential signal with an additional signal having a different frequency to produce a mixed signal; and
   filtering out high frequencies from the mixed signal.

23. The method of claim 21, comprising outputting a signal indicative of a detected target when the target is detected.

* * * * *